(12) United States Patent
Zhang et al.

(10) Patent No.: US 10,825,690 B2
(45) Date of Patent: Nov. 3, 2020

(54) SEMICONDUCTOR STRUCTURES

(71) Applicants: Semiconductor Manufacturing International (Shanghai) Corporation, Shanghai (CN); Semiconductor Manufacturing International (Beijing) Corporation, Beijing (CN)

(72) Inventors: Cheng Long Zhang, Shanghai (CN); Hai Yang Zhang, Shanghai (CN); Yan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/243,297

(22) Filed: Jan. 9, 2019

(65) Prior Publication Data

US 2019/0148157 A1    May 16, 2019

Related U.S. Application Data

(62) Division of application No. 15/872,167, filed on Jan. 16, 2018, now Pat. No. 10,211,062.

(30) Foreign Application Priority Data

Jan. 16, 2017 (CN) .......................... 2017 1 0032472

(51) Int. Cl.
*H01L 21/308* (2006.01)
*H01L 21/3105* (2006.01)
(Continued)

(52) U.S. Cl.
CPC ...... *H01L 21/3088* (2013.01); *H01L 21/0337* (2013.01); *H01L 21/3081* (2013.01);
(Continued)

(58) Field of Classification Search
CPC ........... H01L 21/3088; H01L 21/30604; H01L 21/3061; H01L 21/31055; H01L 21/3086;
(Continued)

(56) References Cited

U.S. PATENT DOCUMENTS 6,638,441 B2    10/2003   Chang et al.
7,892,982 B2     2/2011   Lee et al.
(Continued)

FOREIGN PATENT DOCUMENTS

| CN | 101388325 A | 3/2009 |
|----|-------------|--------|
| CN | 103943468 A | 7/2014 |
| CN | 103943469 A | 7/2014 |

*Primary Examiner* — Thinh T Nguyen
(74) *Attorney, Agent, or Firm* — Anova Law Group, PLLC

(57) ABSTRACT

A semiconductor structure a base substrate and a sidewall spacer layer formed on the base substrate. The sidewall spacer layer includes a plurality of first sidewall spacer layers and a plurality of second sidewall spacer layers spaced apart from each other. At least one sidewall of a second sidewall spacer layer of the plurality of second sidewall spacer layers is formed on a first sidewall spacer layer of the plurality of first sidewall spacer layers. The plurality of first sidewall spacer layers has a thickness greater than the plurality of second sidewall spacer layers, based on a surface of the base substrate. The plurality of first sidewall spacer layers has a material structure different than the plurality of second sidewall spacer layers.

11 Claims, 6 Drawing Sheets

(51) Int. Cl.
    *H01L 21/306*    (2006.01)
    *H01L 21/3115*   (2006.01)
    *H01L 21/311*    (2006.01)
    *H01L 21/033*    (2006.01)
    *H01L 21/768*    (2006.01)

(52) U.S. Cl.
    CPC ...... *H01L 21/3085* (2013.01); *H01L 21/3086* (2013.01); *H01L 21/30604* (2013.01); *H01L 21/31055* (2013.01); *H01L 21/31111* (2013.01); *H01L 21/31155* (2013.01); *H01L 21/76802* (2013.01); *H01L 2924/00* (2013.01); *H01L 2924/0002* (2013.01)

(58) Field of Classification Search
    CPC ......... H01L 21/31155; H01L 21/31111; H01L 21/3085

USPC ................. 257/618, 786, E21.47, 717, 900; 438/401, 671, 679, 761, 763
    See application file for complete search history.

(56) References Cited

U.S. PATENT DOCUMENTS

| | | | |
|---|---|---|---|
| 2004/0235252 A1* | 11/2004 | Cho et al. | H01L 29/6656 438/289 |
| 2007/0212839 A1* | 9/2007 | Chung et al. | H01L 21/7682 438/299 |
| 2008/0029831 A1* | 2/2008 | Chen et al. | H01L 29/665 257/408 |
| 2009/0032963 A1 | 2/2009 | Tran | |
| 2016/0307772 A1 | 10/2016 | Choi et al. | |

* cited by examiner

SEMICONDUCTOR STRUCTURES

CROSS-REFERENCES TO RELATED APPLICATIONS

This application is a divisional of U.S. patent application Ser. No. 15/872,167, filed on Jan. 16, 2018, which claims the priority of Chinese Patent Application No. 201710032472.9, filed on Jan. 16, 2017, the entire content of which is incorporated herein by reference.

FIELD OF THE DISCLOSURE

The present disclosure generally relates to the field of semiconductor fabrication technology and, more particularly, relates to semiconductor structures.

BACKGROUND

Semiconductor technology has been continuously moving toward smaller process nodes following the Moore's law. Devices with powerful functions have been manufactured, although the semiconductor manufacturing becomes more and more difficult. Photolithography is the most critical production line in semiconductor manufacturing process. With the continuous reduction of semiconductor process nodes, the existing light-sources used in lithography technology are unable to meet the needs of semiconductor manufacturing. Extreme ultraviolet (EUV) lithography technology, multi-beam maskless technology, and nano-imprint technology have become hot focus for next generation lithography technology, although they have their own shortcomings and drawbacks, and still need to be improved.

When the Moore's law irreversibly continues to extend the footsteps, double-patterning (DP) technology becomes one of the best choices in semiconductor industry. With minimum changes based on existing lithography facilities, the DP technology can effectively fill the technical gap required for smaller nodes in the field of lithography and also improve the minimum pitch between adjacent semiconductor patterns. The principle of DP technology is to break down a set of high-density patterns into two independent sets of low-density patterns, and then fabricate them in a wafer. Currently, the DP technology includes self-aligned double-patterning (SADP) process, litho-etch-litho-etch (LELE) process, etc. Because the SADP process is less complex and less costly, the SADP process is frequently adopted in the formation of semiconductor devices.

However, when a substrate is etched using an existing DP process, the quality of the target pattern formed after the etching process may be undesirable, which may further affect the performance and the yield of the formed semiconductor structure. The disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor structure. The method includes providing a base substrate, forming a plurality of core layers on the base substrate, forming a sidewall spacer film on the base substrate covering top and sidewall surfaces of the core layers, and forming a sidewall spacer layer by removing a portion of the sidewall spacer film formed above the top surface of the core layers. The sidewall spacer layer includes a first portion having a first thickness on the sidewall surfaces of the core layers, and a second portion having a second thickness on the base substrate. The method further includes removing the plurality of core layers after forming the sidewall spacer layer, removing the second portion of the sidewall spacer layer from the base substrate after removing the core layers, and using the first portion of the sidewall spacer layer as a hard mask layer.

Another aspect of the present disclosure provides a semiconductor structure. The semiconductor structure includes a base substrate and a sidewall spacer layer including a first portion and a second portion formed on a portion of the base substrate. The second portion of the sidewall spacer layer includes a plurality discrete regions formed on the base substrate. The first portion of the sidewall spacer layer includes a plurality of regions formed on at least one end of each region of the second portion of the sidewall spacer layer. Each region of the first portion of the sidewall spacer layer is perpendicular to the surface of the base substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The present disclosure solves problems in conventional patterning processes that etching of the base substrate may lead to poor quality of the formed target pattern, and thus degrade the performance and the yield of the formed semiconductor structure. FIGS. 1-5 illustrate schematic cross-section views of semiconductor structures at certain stages of the fabrication process.

Figure 1:
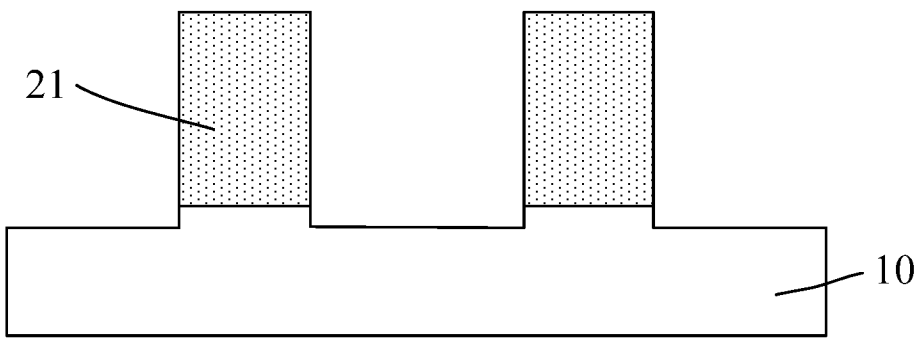
FIGS. 1-5 illustrate schematic cross-section views of semiconductor structures at certain stages of a fabrication process.

Referring to FIG. 1, a base substrate 10 is provided. A plurality of discrete core layers 21 are formed on the base substrate 10. Moreover, during the process to form the core layers 21, the base substrate 10 is over etched so that the top surface of the portion of the base substrate 10 under the core layers 21 is higher than the top surface of the portion of the base substrate exposed by the core layers 21.

Figure 2:
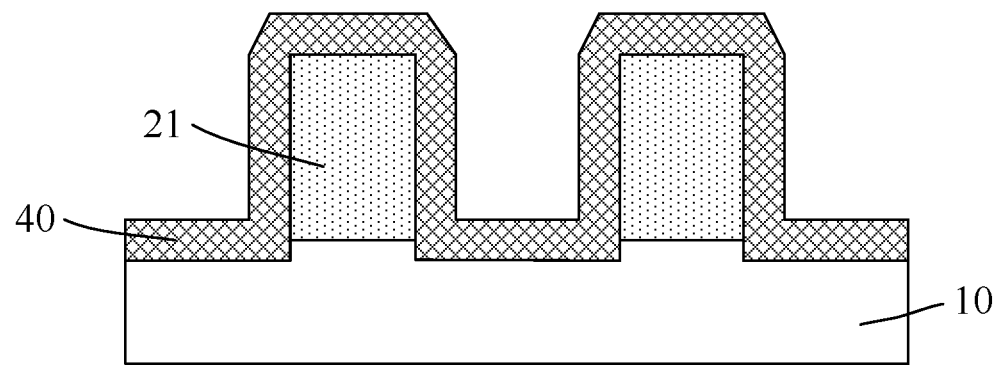

Referring to FIG. 2, a sidewall spacer layer 40 is formed on the surface of the base substrate 10 and also on the sidewall surfaces of the core layers 21.

Figure 3:
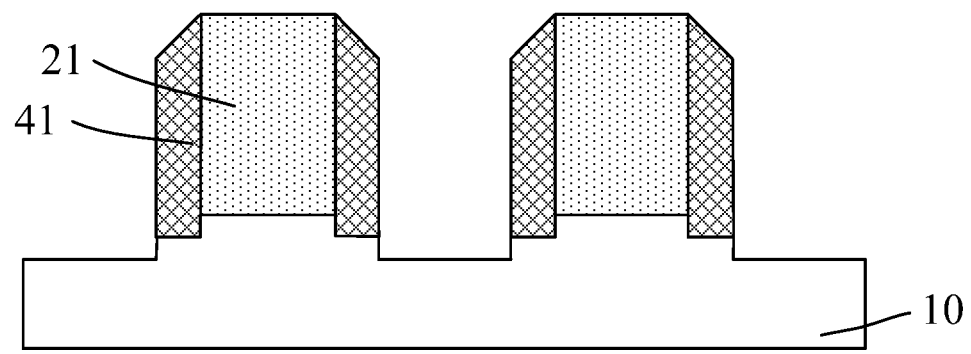

Referring to FIG. 3, a maskless etching process is performed to etch the sidewall spacer layer 40 (referring to FIG. 2). The portion of the sidewall spacer layer 40 formed on the top surface of the core layers 21 and the portion of the sidewall spacer layer 40 formed on the base substrate 10 are removed to expose a portion of the base substrate 10. As such, the remaining portion of the sidewall spacer layer 40 formed on the sidewall surfaces of the core layers 21 becomes a hard mask layer 41. The hard mask layer 41 includes a plurality of discrete portions.

During the maskless etching process to etch the sidewall spacer layer 40, the etching process easily leads to further over etching of the base substrate 10.

Figure 4:
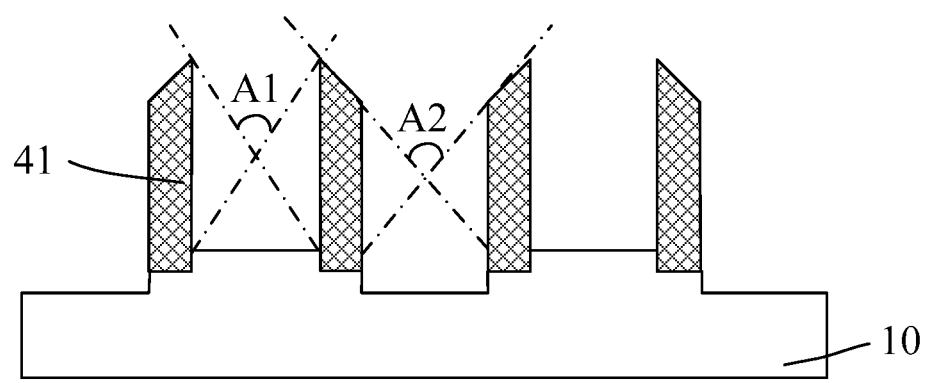

Referring to FIG. 4, the core layers 21 (referring to FIG. 3) are removed.

Figure 5:
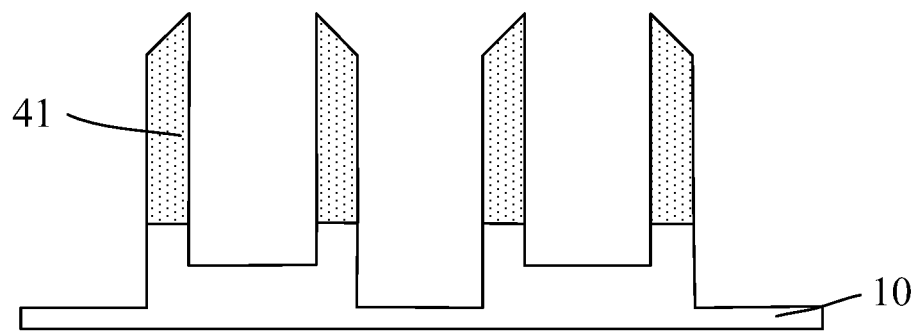

Further, referring to FIG. 5, the base substrate 10 is etched using the hard mask layer 41 as an etch mask to form a target pattern.

According to the fabrication process described above, after removing the core layers 21, the heights of the top surfaces of the base substrate 10 on the two opposite sides of the hard mask layer 41 are different. Therefore, after forming the target pattern by etching the base substrate 10 on both sides of the hard mask layer 41 using the hard mask layer 41 as the etch mask, the heights of the top surfaces of the base substrate 10 on the two opposite sides of the target pattern are also different. The height difference between the top surfaces of the base substrate 10 on the two opposite sides of the target pattern may further affect the quality of the formed target pattern after the etching process, leading to a pitch walking problem for the formed target pattern.

In addition, referring to FIGS. 3-4, after performing the maskless etching process, the hard mask layer 41 formed on the sidewall surface of each core layer 21 has an inclined top surface. That is, the top surface of the hard mask layer 41 is not parallel to the surface of the base substrate 10. Specifically, the portion of the hard mask layer 41 closer to the core layer 21 has a higher top surface. Therefore, after removing the core layers 21, when an etching process using the hard mask layer 41 as the etch mask is performed, the etch species collection angles of the etching process for the two opposite sides of the same hard mask layer 41 are different.

For example, the etch species collection angle in the region formed after removing the core layer 21 is a first angle A1 (referring to FIG. 4), and the etch species collection angle in the region between neighboring portions of the hard mask layer 41 prior to removing the core layer 21 is a second angle A2 (referring to FIG. 4). Therefore, affected by the inclined top surface of the hard mask layer 41, the first angle A1 is smaller than the second angle A2. Moreover, during the etching process using the hard mask layer 41 as the etch mask, the etch rate in the region formed after removing the core layer 21 is a first rate, and the etch rate in the region between neighboring portions of the hard mask layer 41 prior to removing the core layer 21 is a second rate. Because the first angle A1 is smaller than the second angle A2, the first rate is smaller than the second rate, and the effect is known as the micro-loading effect. The micro-loading effect may further increase the height difference between the top surfaces of the base substrate 10 on the two opposite sides of the target pattern.

Figure 14:
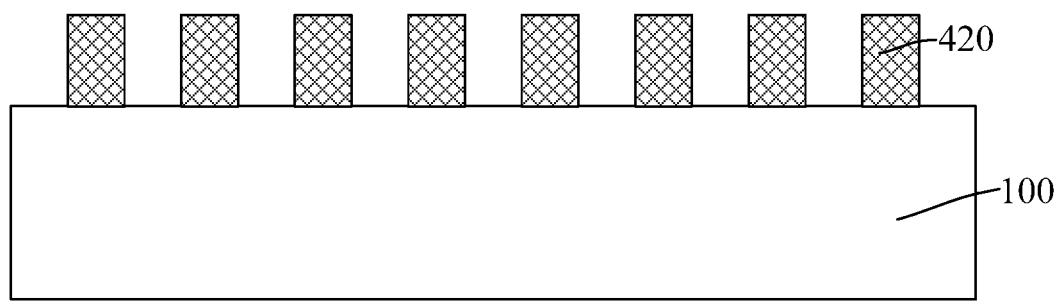
Figure 15:
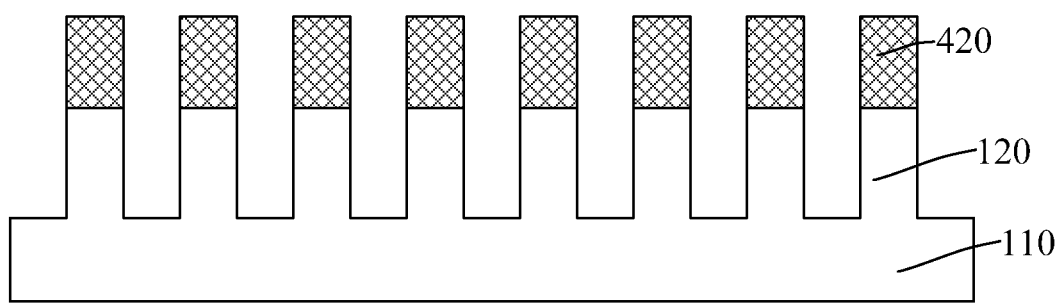
Figure 16:
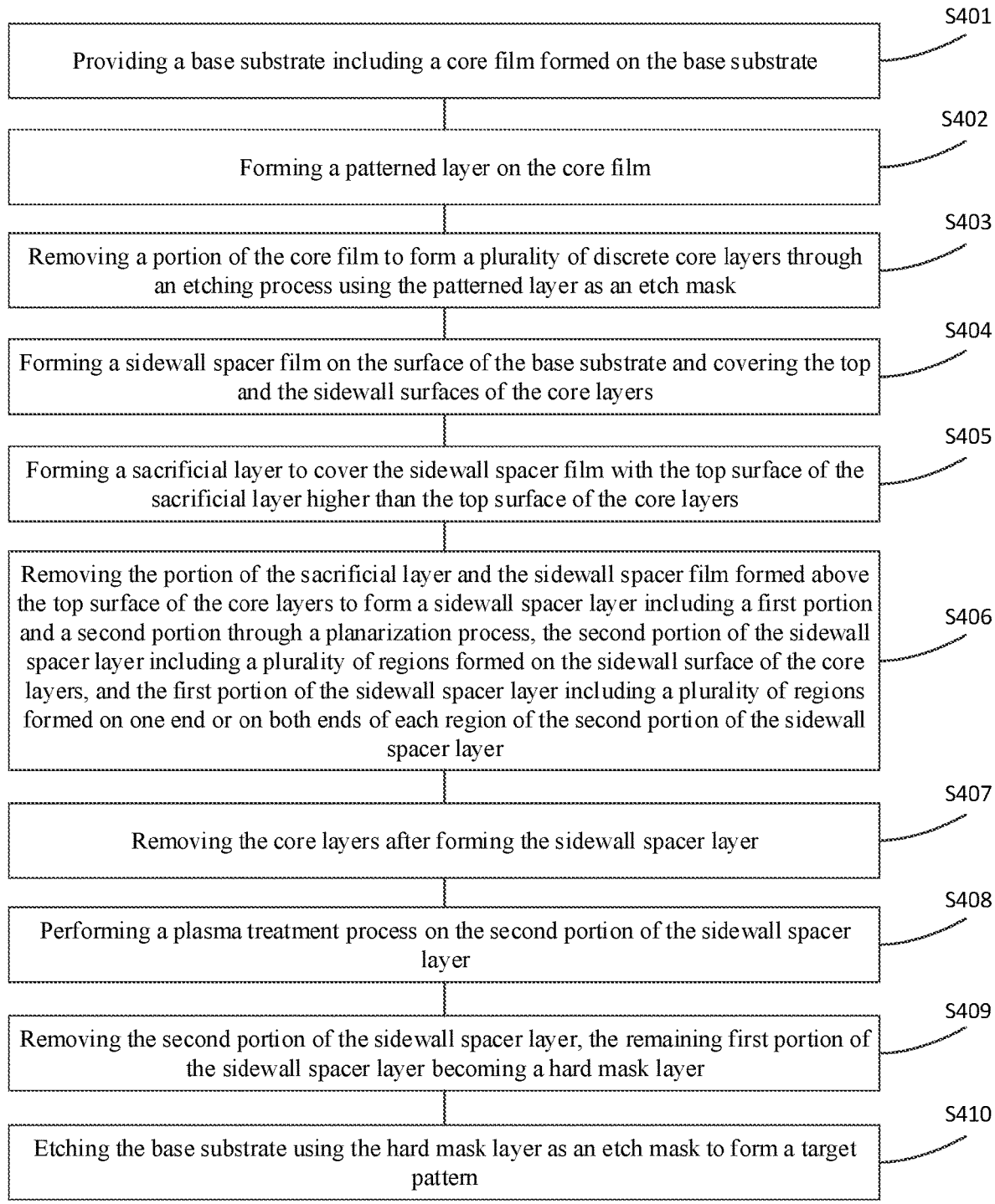
FIG. 16 illustrates a flowchart of an exemplary method for fabricating a semiconductor structure consistent with various embodiments of the present disclosure.

The present disclosure provides a method for fabricating a semiconductor structure to solve the problems described above. FIG. 16 illustrates a flowchart of an exemplary method for fabricating a semiconductor structure consistent with various embodiments of the present disclosure. FIGS. 6-15 illustrate schematic cross-section views of semiconductor structures at certain stages of the exemplary fabrication process.

Figure 6:
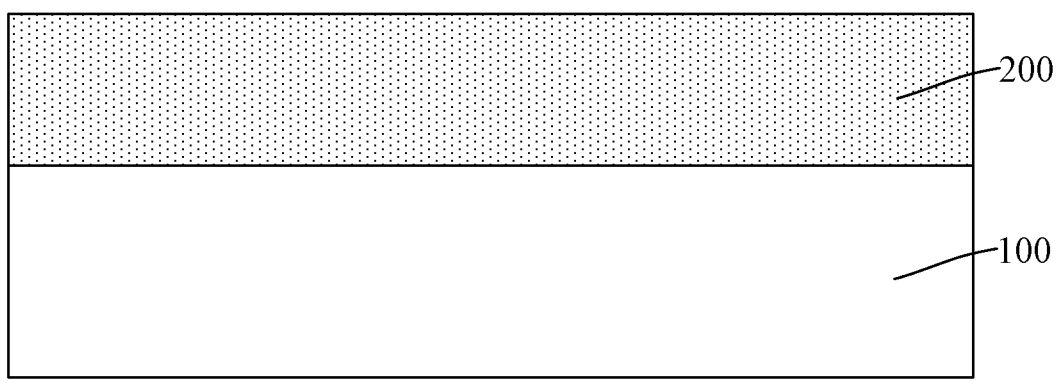
FIGS. 6-15 illustrate schematic cross-section views of semiconductor structures at certain stages of an exemplary fabrication process for a semiconductor structure consistent with various embodiments of the present disclosure.

Referring to FIG. 16, at the beginning of the fabrication process, a base substrate including a core film formed on the base substrate is provided (S401). FIG. 6 shows a schematic cross-section view of a corresponding semiconductor structure.

Referring to FIG. 6, a base substrate 100 including a core film 200 formed on the base substrate 100 may be provided. The base substrate 100 may be used to subsequently form a target pattern. The base substrate 100 may be made of silicon, germanium, SiGe, SiC, InAs, or any other appropriate semiconductor material. The base substrate 100 may also be made of silicon on insulator (SOI), germanium on insulator (GOI), SiGe on insulator, or any other appropriate semiconductor structure. In one embodiment, the base substrate 100 is made of silicon.

The base substrate 100 may also include a plurality of semiconductor devices including P-type metal-oxide-semiconductor (PMOS) transistors, complementary metal-oxide-semiconductor (CMOS) transistors, N-type metal-oxide-semiconductor (NMOS) transistors, resistors, capacitors, inductors, etc. An interfacial layer may also be formed on the surface of the base substrate 100. The interfacial layer may be made of $SiO_x$, $SiN_x$, SiON, etc.

In other embodiments, the base substrate may include an initial substrate and a function layer formed on the surface of the initial substrate. During a subsequent patterning process performed on the base substrate, the function layer formed on the surface of the initial substrate may be patterned.

In one embodiment, subsequent fabrication process may include patterning the base substrate 100 to form a substrate and a plurality of discrete fin structures.

Figure 7:
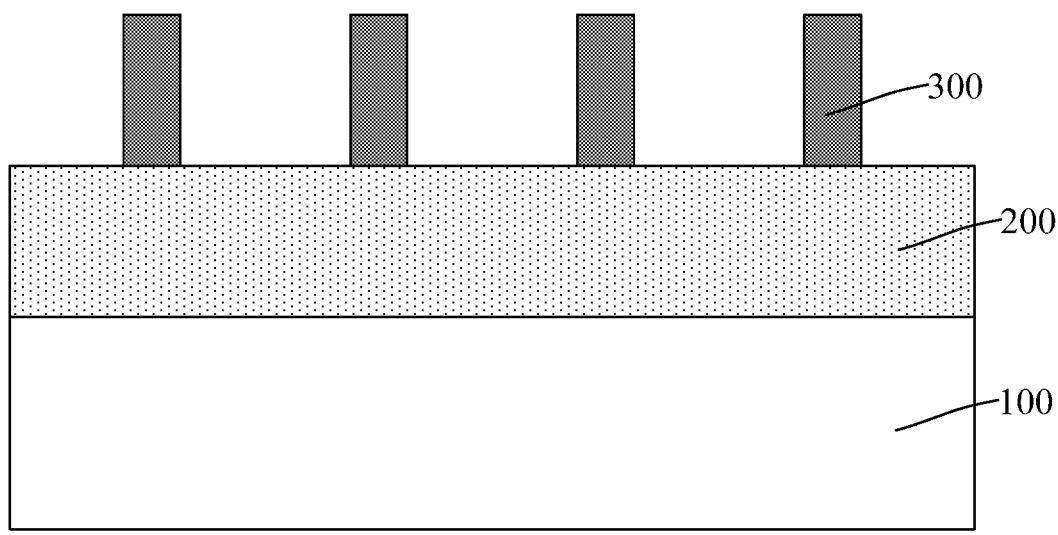

Further, returning to FIG. 16, a patterned layer may be formed on the core film (S402). FIG. 7 shows a schematic cross-section view of a corresponding semiconductor structure.

Referring to FIG. 7, a patterned layer 300 may be formed on the core film 200. The patterned layer 300 may be used as a mask to pattern the core film 200 in a subsequent process. In one embodiment, the patterned layer 300 is made of photoresist.

Moreover, prior to forming the patterned layer 300, the fabrication process may also include forming a top anti-reflective coating (not shown) on the surface of the core film 200. The presence of the top anti-reflective coating may help improve the topography quality of the patterned layer 300.

Figure 8:
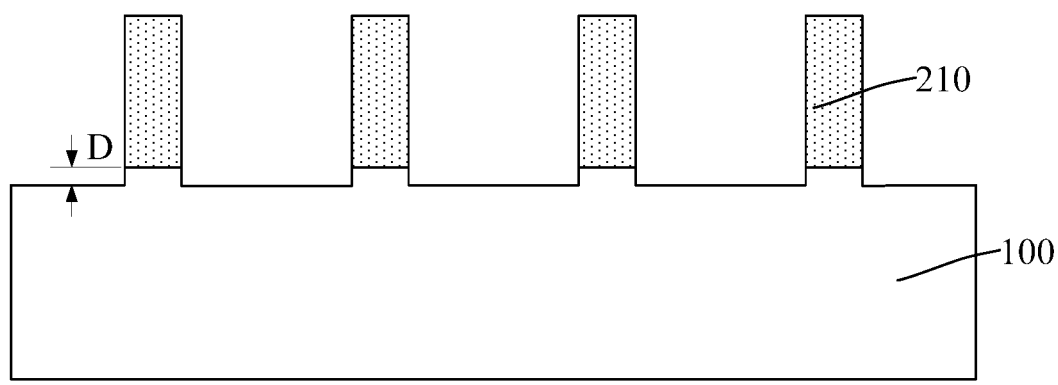

Further, returning to FIG. 16, a portion of the core film is removed to form a plurality of discrete core layers through an etching process using the patterned layer as an etch mask (S403). FIG. 8 shows a schematic cross-section view of a corresponding semiconductor structure.

Referring to FIG. 8, a portion of the core film 200 (referring to FIG. 7) formed on the base substrate 100 may be removed through an etching process using the patterned layer 300 (referring to FIG. 7) as an etch mask. The remaining portion of the core film 200 may thus become a plurality of discrete core layers 210.

In one embodiment, the portion of the core film 200 formed on the base substrate 100 may be removed by a dry etching process. For example, a plasma dry etching process may be performed to remove the portion of the core film 200. In one embodiment, the core film 200 is made of amorphous carbon, and the etching gas used in the plasma dry etching process is $O_2$ or $CO_2$.

In one embodiment, after forming the core layers 210, the patterned layer 300 (referring to FIG. 7) and the top anti-reflective coating (not shown) may be removed by an ashing process or a wet-etching photoresist-removal process.

During the etching process to form the plurality of core layers 210, the base substrate 100 may be over etched so that the top surface of the base substrate under the formed core layers 210 may be higher than the top surface of the base substrate exposed by the plurality of core layers 210. That is, the top surface of the base substrate 100 under the core layers 210 and the top surface of the base substrate 100 exposed by the core layers 210 may have a height difference D as shown in FIG. 8.

Figure 9:
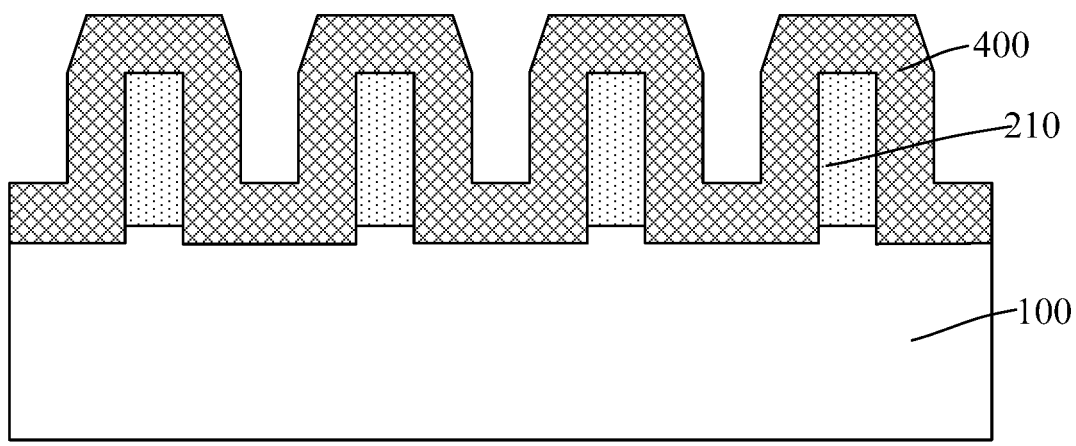

Further, returning to FIG. 16, a sidewall spacer film may be formed on the surface of the base substrate and the top and the sidewall surfaces of the core layers (S404). FIG. 9 shows a schematic cross-section view of a corresponding semiconductor structure.

Referring to FIG. 9, a sidewall spacer film 400 may be formed on the top and the sidewall surfaces of each core layer 210. The sidewall spacer film 400 may also be formed on the base substrate 100.

In a subsequent process, the portion of the sidewall spacer film 400 formed on the base substrate 100 and the sidewall of the core layers 210 may become a sidewall spacer layer. The formed sidewall spacer layer may provide a process basis for subsequent formation of a hard mask layer on the sidewalls of the core layers 210.

The material used to form the sidewall spacer film 400 may be different from the material used to form the core layers 210. In addition, the material used to form the sidewall spacer film 400 may also be different from the material used to form the base substrate 100. Therefore, the influence of the subsequent removal of the core layers 210 on the formed sidewall spacer layer may be reduced. Moreover, the formed hard mask layer may also be used as a mask during a subsequent process to etch the base substrate 100.

Therefore, the sidewall spacer film 400 may be made of $SiN_x$, SiON, SiCN, etc. In one embodiment, the sidewall spacer film 400 is made of $SiN_x$.

The sidewall spacer film 400 may be formed by a chemical vapor deposition (CVD) process, a physical vapor deposition (PVD) process, or an atomic layer deposition (ALD) process. In one embodiment, the sidewall spacer film 400 is formed by an ALD process such that the step coverage of the formed sidewall spacer film 400 may be desired. Therefore, the sidewall spacer film 400 may demonstrate desired coverage properties at the corners formed by the base substrate 100 and the core layers 210.

The sidewall spacer film 400 may provide a process basis for subsequent formation of a hard mask layer. The formed hard mask layer may be used as an etch mask to subsequently etch the base substrate 100 and thus form a target pattern. Therefore, the thickness of the sidewall spacer film 400 may be determined based on the size of the subsequently-formed target pattern. In one embodiment, the thickness of the sidewall spacer film 400 may be in a range of approximately 50 Å to 500 Å. Accordingly, along the normal direction of the base substrate 100, the thickness of the sidewall film 400 formed on the base substrate 100 may be in a range of approximately 50 Å to 500 Å.

Further, because of the thickness of the core layers 210, the sidewall spacer film 400 formed on the sidewall surface of each core layer 210 may have an inclined top surface. Specifically, the portion of the sidewall spacer film 400 closer to the sidewall of the core layer 210 may have a higher top surface as compare to the portion of the sidewall spacer film 400 further away from the sidewall of the core layer 210.

Figure 10:
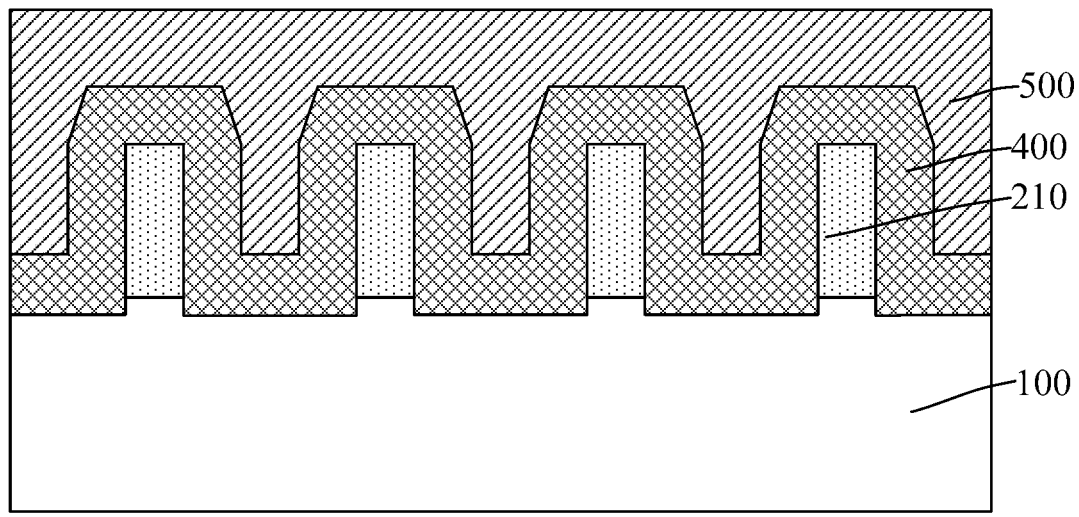

Further, returning to FIG. 16, a sacrificial layer may be formed to cover the sidewall spacer film with the top surface of the sacrificial layer higher than the top surface of the core layers (S405). FIG. 10 shows a schematic cross-section view of a corresponding semiconductor structure.

Referring to FIG. 10, a sacrificial layer 500 may be formed to cover the sidewall spacer film 400. Moreover, the top surface of the sacrificial layer 500 may be higher than the top surface of the core layers 210.

The material used to form the sacrificial layer 500 may be different from the material used to form the sidewall spacer film 400. In addition, the material used to form the sacrificial layer 500 may be different from the material used to form the core layers 210. Moreover, the material used to form the sacrificial layer 500 may also be different from the material used to form the base substrate 100. The sacrificial layer 500 may be made of a material that can be easily removed such that etching damages to the base substrate 100 and the sidewall spacer film 400 due to subsequent removal of the sacrificial layer 500 may be reduced.

Taking all the above factors into account, the sacrificial layer 500 may be made of one or more of $SiO_x$, SiC, SiCO, SiCON, BN, amorphous carbon, organic dielectric layer (ODL) material, dielectric anti-reflective coating (DARC) material, bottom anti-reflective coating (BARC) material, etc. In one embodiment, the sacrificial layer 500 is made of an ODL material and formed by a spin-coating process. In addition, the top surface of the sacrificial layer 500 may be higher than the top surface of the sidewall spacer film 400.

Figure 11:
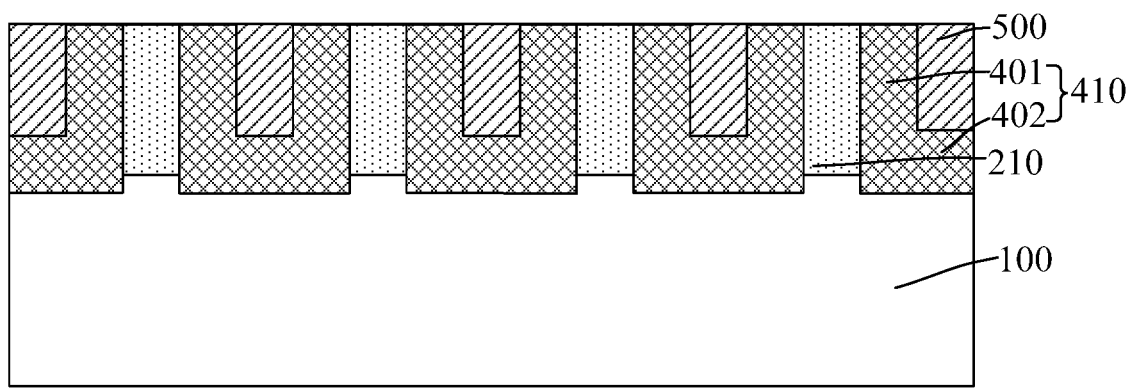

Further, returning to FIG. 16, a planarization process may be performed on the top of the sacrificial layer and the sidewall spacer film to remove the portion of the sacrificial layer and the sidewall spacer film formed above the top surface of the core layers (S406). FIG. 11 shows a schematic cross-section view of a corresponding semiconductor structure.

Referring to FIG. 11, a planarization process may be performed on the sacrificial layer 500 and the sidewall spacer film 400 to remove the portion of the sacrificial layer 500 and the sidewall spacer film 400 formed above the top surface of the core layers 210. After the planarization process, the top surface of the core layers 210 may be exposed.

In one embodiment, after the planarization process, the remaining portion of the sidewall spacer film 400 on the base substrate 100 and the sidewall surfaces of the core layers 210 may serve as a sidewall spacer layer 410. The portion of the sidewall spacer layer 410 having a first thickness on the sidewall surfaces of the core layers 210 may be a first portion 401 of the sidewall spacer layer 410, and the portion of the sidewall spacer layer 410 having a second thickness on the base substrate 100 may be a second portion 402 of the sidewall spacer layer 410.

After performing the planarization process, the top surfaces of the sacrificial layer 500, the sidewall spacer film 400, and the core layers 210 may be leveled with each other. Therefore, the top surface of the first portion 401 of the sidewall spacer layer 410 may be a planar surface.

In one embodiment, the termination of the planarization process performed on the sacrificial layer 500 and the sidewall spacer film 400 may be determined as when the top surface of the sidewall spacer film 400 becomes parallel to the surface of the base substrate 100. As such, after the planarization process, the sidewall spacer layer 410 on the sidewall surfaces of the core layers 210 may not have an inclined top surface. Therefore, in a subsequent process to etch the base substrate 100 using the sidewall spacer layer 410 formed on the sidewall surfaces of the core layers 210 as an etch mask, the micro-loading effect due to the difference in the etch species collection angle between neighboring regions of the mask layer may be avoided.

Moreover, during the planarization process, when the lowest point of the top surface of the sidewall spacer film 400 formed on the sidewall surfaces of the core layers 201 is higher than or leveled with the top surface of the core layers 210, the planarization process may only be performed on the sidewall spacer film 400 and the sacrificial layer 500. That is, only a top portion of the sidewall spacer film 400 and the sacrificial layer 500 may be removed during the planarization process. Alternatively, besides removing a top portion of the sidewall spacer film 400 and the sacrificial layer 500, the planarization process may also remove a portion of the core layers 210.

When the lowest point of the top surface of the sidewall spacer film 400 formed on the sidewall surfaces of the core layers 201 is lower than the top surface of the core layers 210, the planarization process may be performed on the sidewall spacer film 400, the sacrificial layer 500, as well as the core layers 210. That is, besides removing a top portion of the sidewall spacer film 400 and the sacrificial layer 500, the planarization process may also remove a portion of the core layers 210.

In one embodiment, the planarization process may include performing chemical mechanical polishing (CMP) on the sacrificial layer 500 until the top surfaces of the sidewall spacer film 400 are exposed, and then performing a dry etching process on the sacrificial layer 500 and the sidewall spacer film 400. Moreover, a top portion of the core layers 210 may be etched during the dry etching process.

In one embodiment, the dry etching process may use an etching gas including a carbon fluoride gas. The carbon fluoride gas may include $C_4F_8$ and/or $CH_3F$.

By using a CMP process to significantly remove the sacrificial layer 500, which may have a substantially large thickness, the process time of the planarization process may be effectively reduced. Further, by performing a dry etching process on the sacrificial layer 500 and the sidewall spacer film 400, the flatness of the top surface of the sidewall spacer film 400 after the planarization process may be improved. Therefore, the topography quality of the hard mask layer used in a subsequent etching process performed on the surface of the base substrate 100 may be improved.

In some other embodiments, the planarization process may be a CMP process. Alternatively, in other embodiments, the planarization process may be a dry etching process. Moreover, the termination of the planarization process performed on the top surfaces of the sacrificial layer and the sidewall spacer film may be determined as when the top surface of the core layers is exposed. That is, the core layers may not need to undergo the planarization process.

Moreover, after forming the sidewall spacer layer 410, the first portion 401 of the sidewall spacer layer 410 may serve as a hard mask layer in a subsequent process to etch the base substrate 100. Therefore, after the planarization process, the thickness of the first portion 401 of the sidewall spacer layer 410 formed on the sidewall surfaces of the core layers 210 may be larger than the thickness of the subsequently-removed portion of the base substrate 100, preventing the hard mask layer from being completely consumed before the target pattern is formed. That is, it is ensured that the hard mask layer can always serve as a mask through the entire process to etch the base substrate 100.

Figure 12:
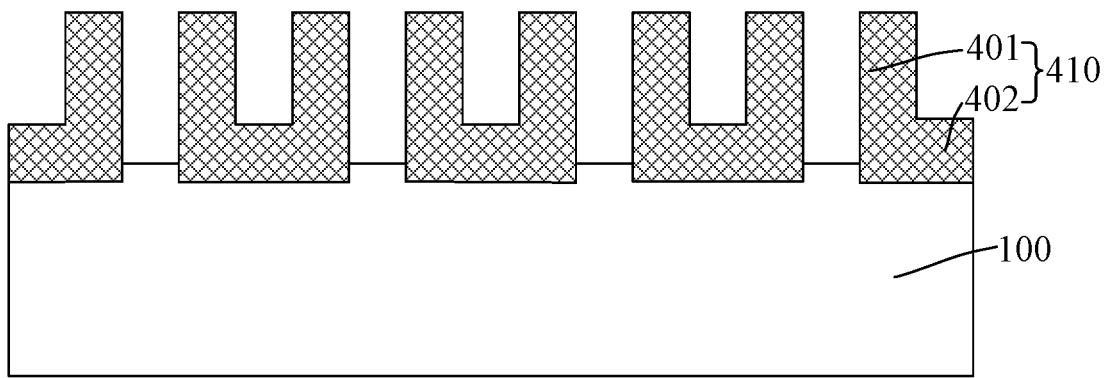

Further, returning to FIG. 16, after forming the sidewall spacer layer, the core layers may be removed (S407). FIG. 12 shows a schematic cross-section view of a corresponding semiconductor structure.

Referring to FIG. 12, after forming the sidewall spacer layer 410, the core layers 210 (referring to FIG. 11) may be removed. Moreover, in one embodiment, a sacrificial layer 500 (referring to FIG. 11) is formed on the sidewall spacer layer 410, and accordingly, after forming the sidewall spacer layer 410, the fabrication process may also include removing the sacrificial layer 500.

In one embodiment, the sacrificial layer 500 and the core layers 210 may be simultaneously removed by a same process. For example, a dry etching process may be performed to remove the sacrificial layer 500 and the core layers 210. The dry etching process may use an etching gas including $O_2$, $N_2$, or $H_2$.

In other embodiments, the sacrificial layer and the core layers may be removed by different processes.

Figure 13:
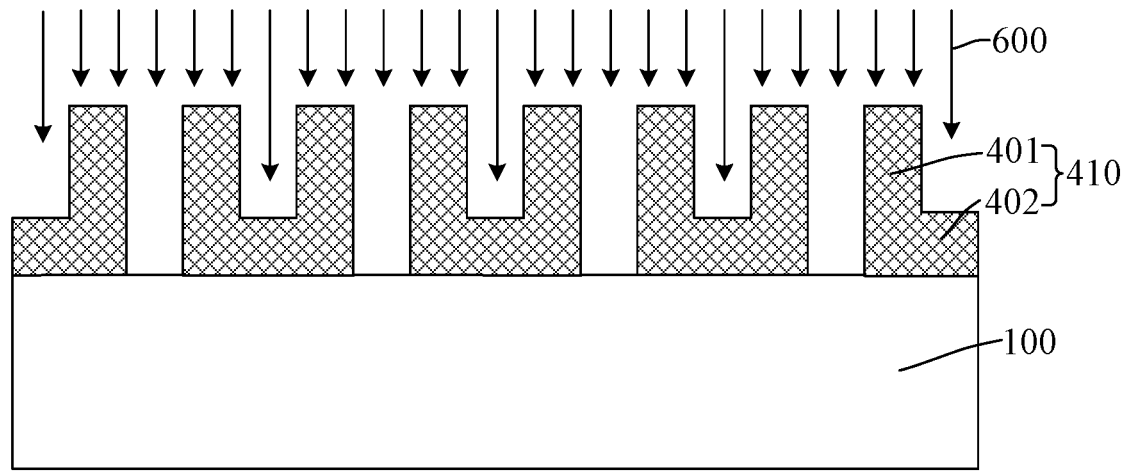

Further, returning to FIG. 16, after removing the core layers, a plasma treatment process may be performed on the second portion of the sidewall spacer layer (S408). FIG. 13 shows a schematic diagram of a plasma treatment process performed on the second portion 402 of the sidewall spacer layer 410.

Referring to FIG. 13, a plasma treatment process 600 may be performed on the second portion 402 of the sidewall spacer layer 410. The plasma treatment process 600 may be performed under a $H_2$ or He environment.

Through the plasma treatment process 600, hydrogen (H) atoms or helium (He) atoms may be implanted into the second portion 402 of the sidewall spacer layer 410, and thus reduce the bonding energy of the material of the second portion 402 of the sidewall spacer layer 410. Although the second portion 402 and the first portion 401 of the sidewall spacer layer 410 are both made of $SiN_x$, the material structure of the second portion 402 of the sidewall spacer layer 410 may not be completely the same as the material structure of the first portion 401 of the sidewall spacer layer 410 that is not affected by the plasma treatment process 600. Therefore, the plasma treatment process 600 may improve the ratio of the etch rate of the second portion 402 of the sidewall spacer layer 410 to the etch rate of the first portion 401 of the sidewall spacer layer 410 during a subsequent etching process. That is, the ratio of etch rates (or the etch selectivity) of the second portion 402 of the sidewall spacer layer 410 with respect to the first portion 401 of the sidewall spacer layer 410 may be improved. Therefore, during the subsequent etching process, the removal rate of the second portion 402 of the sidewall spacer layer 410 may be larger than the removal rate of the first portion 401 of the sidewall spacer layer 410 that is not affected by the plasma treatment process 600. Moreover, the removal rate of the second portion 402 of the sidewall spacer layer 410 may also be larger than the removal rate of the base substrate 100. As such, during the subsequent process to remove the second portion 402 of the sidewall spacer layer 410, the etch consumption of the first portion 401 of the sidewall spacer layer 410 and the base substrate 100 may be reduced.

In one embodiment, the plasma treatment process 600 performed on the second portion 402 of the sidewall spacer layer 410 may include introducing $H_2$ or He into a capacitive coupled plasma (CCP) chamber. During the plasma treatment process 600, the pressure of the chamber may be controlled in a range of approximately 2 mTorr to 100 mTorr, and the offset power may be in a range from 0 W to approximately 500 W.

The process parameters of the plasma treatment process 600 may be determined based on the thickness of the second portion 402 of the sidewall spacer layer 410. Specifically, the process parameters of the plasma treatment process 600 may be selected to ensure that the entire second portion 402 of the sidewall spacer layer can be affected by the plasma treatment process 600.

In one embodiment, the gas flow rate of $H_2$ or He may not be too small or too large. When the gas flow rate is too small, the effect of the plasma treatment process 600 on the second portion 402 of the sidewall spacer layer 410 may be poor. However, when the gas flow rate is too large, an excessive amount of the first portion 401 of the sidewall spacer layer 410 may be affected by the plasma treatment process 600, causing undesired effects on the subsequent fabrication process. Therefore, in one embodiment, the gas flow rate of $H_2$ or He may be in a range of approximately 50 sccm to 500 sccm.

Moreover, the process time of the plasma treatment process 600 may not be too short or too long. In one embodiment, corresponding to a longer process time, a larger amount of the second portion 402 of the sidewall spacer layer 410 may be affected by the plasma treatment process 600. Therefore, when the process time is too short, the second portion 402 of the sidewall spacer layer 410 may not be completely affected by the plasma treatment process 600, and accordingly, the second portion 402 of the sidewall spacer layer 410 may not be fully removed. However, when the process time is too long, the process risk may increase, resulting in plasma damage of the exposed portion of the substrate 100. Therefore, in one embodiment, the process time of the plasma treatment process may be in a range of approximately 50 seconds to 700 seconds.

In one embodiment, because the first portion 401 of the sidewall spacer layer 410 may also be exposed to the process environment during the plasma treatment process 600, the plasma treatment process 600 may also reduce the bonding energy in a top region of the first portion 401 of the sidewall spacer layer 410.

In one embodiment, the first portion 401 of the sidewall spacer layer 410 may include a plurality of discrete regions. Further, the portion of the base substrate 100 exposed between the neighboring regions of the first portion 401 of the sidewall spacer layer 410 may also be exposed to the process environment during the plasma treatment process 600. Therefore, the plasma treatment process 600 may also affect the exposed portion of the base substrate 100, although the influence may be insignificant.

Further, returning to FIG. 16, after performing the plasma treatment process, the second portion of the sidewall spacer layer may be removed, and the remaining first portion of the sidewall spacer becomes a hard mask layer (S409). FIG. 14 shows a schematic cross-section view of a corresponding semiconductor structure.

Referring to FIG. 14, after removing the core layers 210 (referring to FIG. 11) and performing the plasma treatment process 600 (referring to FIG. 13), the second portion 402 of the sidewall spacer layer 410 (referring to FIG. 13) may be removed. After the removal of the second portion 402 of the sidewall spacer layer 410, the remaining first portion 401 of the sidewall spacer layer 410 (referring to FIG. 13) may thus become a hard mask layer 420. The hard mask layer 420 may serve as an etch mask in a subsequent process to etch the base substrate 100.

In one embodiment, after forming the sidewall spacer layer 410 (referring to FIG. 13) through the planarization process, the top surface of the first portion 401 of the sidewall spacer layer 410 may be a planar surface. Accordingly, the hard mask layer 420 formed from the first portion 401 of the sidewall spacer layer 410 may have a planar top surface.

In one embodiment, the sidewall spacer film 400 (referring to FIG. 10) may be made of $SiN_x$. Therefore, the hard mask layer 420 may also be made of $SiN_x$.

In one embodiment, the second portion 402 of the sidewall spacer layer 410 may be removed by a wet etching process. The etch solution used in the wet etching process may include a hydrogen fluoride acid solution.

In one embodiment, after performing the plasma treatment process 600, the bonding energy in the material of the second portion 402 of the sidewall spacer layer 410 may be reduced. Therefore, by performing the wet etching process using the hydrogen fluoride acid solution, the second portion 402 of the sidewall spacer layer 410 may be peeled off. In addition, as compared to using a phosphoric acid solution, the wet etching process using the hydrogen fluoride acid solution may be able to improve the stability of the etching effect and avoid the problem of excessive etching rate. As such, the topography quality of the formed hard mask layer 420 may be improved. Moreover, using the hydrogen fluoride acid solution in the wet etching process may also reduce etch consumption of the base substrate 100.

The process parameters of the wet etching process may be determined based on the thickness of the sidewall spacer layer 410 affected by the plasma treatment process 600 (referring to FIG. 13). In one embodiment, because the entire second portion 402 of the sidewall spacer layer is affected by the plasma treatment process 600, the process parameters of the wet etching process are thus determined by the thickness of the second portion 402 of the sidewall spacer layer 410.

Moreover, the hydrogen fluoride acid solution may be a diluted hydrogen fluoride acid (DHF) solution. The volume percentage of the hydrogen fluoride acid may not be too low or too high. When the volume percentage of the hydrogen fluoride acid is too low, the removal rate on the second portion 402 of the sidewall spacer layer 410 may be too small, and thus the process time to remove the second portion 402 of the sidewall spacer layer 410 may be increased. However, when the volume percentage of the hydrogen fluoride acid is too high, the process risk may increase. Therefore, in one embodiment, the volume percentage of the hydrogen fluoride acid may be in a range of approximately 0.9% to 1.1%.

Further, the etch time of the wet etching process may not be too short or too long. When the etch time is too short, the second portion 402 of the sidewall spacer layer 410 may not be completely removed. However, when the etch time is too long, after removing the second portion 402 of the sidewall spacer layer 410, the extra process time may be wasted and the cost may increase. Moreover, an extra etch time may also easily increase the process risk. Therefore, in one embodiment, the etch time may be controlled in a range of approximately 50 seconds to 70 seconds.

In addition, during the plasma treatment process 600, the bonding energy in the material of a top region of the first portion 401 of the sidewall spacer layer 410 (referring to FIG. 13) may be reduced. Therefore, the wet etching process may also remove the top region of the first portion 401 of the sidewall spacer layer 410. In one embodiment, along the normal direction of the base substrate 100, the removed top region of the first portion 401 of the sidewall spacer layer 410 corresponds to the thickness of the second portion 402 of the sidewall spacer layer 410. Therefore, after forming the hard mask layer 420, the thickness of the hard mask layer 420 along the normal direction of the base substrate 100 may be smaller than the thickness of the first portion 402 of the sidewall spacer layer 410 before performing the wet etching process.

In one embodiment, the plasma treatment process 600 (referring to FIG. 13) may also affect the exposed portion of the base substrate 100, and thus the wet etching process may consume the portion of the base substrate 100 affected by the plasma treatment process 600. However, because the influence of plasma treatment process 600 on the exposed portion of the base substrate 100 may be insignificant, the consumed amount of the base substrate 100 may be relatively small.

As described above, the etching process to form the plurality of core layers 210 may easily cause over etching of the base substrate 100 such that the top surface of the portion of the base substrate 100 under the core layers 210 may be higher than the top surface of the portion of the base substrate 100 exposed by the core layers 210 (referring to FIG. 8). In one embodiment, a height difference between the top surface of the portion of the base substrate 100 under the core layers 210 and the top surface of the base substrate 100 exposed by the core layers 210 may be D. After forming the sidewall spacer layer 410 (referring to FIG. 12), the portion of the base substrate 100 previously exposed by the core layers 210 may correspond to the portion of the base substrate 100 under the sidewall spacer layer 410. Further, the plasma treatment process 600 (referring to FIG. 13) may consume a portion of the base substrate 100 between different regions of the first portion 401 of the sidewall spacer layer 410. That is, a portion of the base substrate 100 previously covered by the core layers 210 (referring to FIG. 8) may be removed. Therefore, through the plasma treatment process 600, the initial height difference D may be reduced or eliminated, improving the flatness of the surface of the base substrate 100.

Further, returning to FIG. 16, the base substrate may be etched using the hard mask layer as an etch mask to form a target pattern (S410). FIG. 15 shows a schematic cross-section view of a corresponding semiconductor structure.

Referring to FIG. 15, after forming the hard mask layer 420, the base substrate 100 (referring to FIG. 14) may be etched using the hard mask layer 420 as an etch mask. After etching, a target pattern may be formed on the base substrate 100. By etching the base substrate 100 using the hard mask layer 420 as the etch mask, a substrate 110 and a plurality of discrete fin structures 120 on the substrate 110 may be formed from the base substrate 100.

In one embodiment, a remaining portion of the base substrate 100 after etching may become the substrate 110, and the plurality of protrusions on the substrate 110 may be the fin structures 120.

Moreover, in one embodiment, the base substrate 100 is made of silicon, and accordingly, the substrate 110 and the plurality of fin structures 120 are also made of silicon.

Further, during the process to form the hard mask layer 420 (referring to FIG. 14), a sidewall spacer film 400 (referring to FIG. 9) may be formed on the top and sidewall surfaces of the core layers 210 (referring to FIG. 9) and also on the base substrate 100 (referring to FIG. 9). After forming the sidewall spacer film 400, the portion of the sidewall spacer film 400 formed above the top surface of the core layers 210 may be removed and only the portion of the sidewall spacer film 400 formed on the base substrate and the sidewall surfaces of the core layers 210 may be retained to serve as a sidewall spacer layer 410 (referring to FIG. 11). Moreover, the sidewall spacer layer 410 may further include a first portion 401 formed on the sidewall surfaces of the core layers 210 and a second portion 402 formed on the base substrate 100. Therefore, the top surface of the first portion 401 of the sidewall spacer layer 410 may become a planer surface. Accordingly, after the second portion 402 of the sidewall spacer layer 410 is removed and the remaining first portion 401 of the sidewall spacer layer becomes a hard mask layer 420, the top surface of the hard mask layer 420 may be a planar surface. Compared to the method of forming a hard mask layer by etching etch the sidewall spacer film through a maskless etching process, the disclosed method may prevent forming an inclined top surface for the hard mask layer 420. Therefore, the formed hard mask layer 420 may have desired topography. The formed hard mask layer 420 may further used as an etch mask to subsequently etch the base substrate 100, and thus may avoid the variation of the etch species collection angle. Therefore, the quality of the formed target pattern may be improved, which may further improve the performance and the product yield of the formed semiconductor structure.

The present disclosure also provides a semiconductor structure. FIG. 13 shows a schematic cross-section view of a semiconductor structure consistent with various embodiments of the present disclosure.

Referring to FIG. 13, the semiconductor structure may include a base substrate 100 and a sidewall spacer layer 410 formed on a portion of the base substrate 100. The sidewall spacer layer 140 may include a first portion 401 and a second portion 402. The second portion 402 of the sidewall spacer layer 410 may include a plurality of discrete regions formed on the base substrate 100 and the first portion 401 of the sidewall spacer layer 140 may be formed at one or both ends of each region of the second portion 402 of the sidewall spacer layer 410. The first portion 401 of the sidewall spacer layer 410 and the second portion 402 of the sidewall spacer layer 410 may be perpendicular to each other. That is, the thickness direction of the first portion 401 of the sidewall spacer layer 410 may be parallel to the surface of the base substrate 100, while the thickness direction of the second portion 402 of the sidewall spacer layer 410 may be perpendicular to the surface of the base substrate 100.

During a semiconductor fabrication process, the base substrate 100 may be further patterned to form a target pattern. For example, the base substrate 100 may be patterned to form a substrate and a plurality of fin structures. The base substrate 100 may be made of silicon, germanium, SiGe, SiC, InAs, or any other appropriate semiconductor material. The base substrate 100 may also be made of SOI, GOI, SiGe on insulator, or any other appropriate semiconductor structure. In one embodiment, the base substrate 100 is made of silicon.

The base substrate 100 may also include a plurality of semiconductor devices including PMOS transistors, CMOS transistors, NMOS transistors, resistors, capacitors, inductors, etc. An interfacial layer may also be formed on the surface of the base substrate 100. The interfacial layer may be made of $SiO_x$, $SiN_x$, SiON, etc.

In other embodiments, the base substrate may include a substrate and a function layer formed on the surface of the substrate. During a subsequent patterning process performed on the base substrate, the function layer formed on the surface of the substrate may be patterned.

During a process to further form a target pattern from the semiconductor structure, the second portion 402 of the sidewall spacer layer 410 may be removed, and the remaining first portion 401 of the sidewall spacer layer 410 may serve as a hard mask layer. The hard mask layer may be used as an etch mask during the process to etch the base substrate 100 in order to form the target pattern. Therefore, the sidewall spacer layer 410 may be made of a material different from the material of the base substrate 100.

In one embodiment, the sidewall spacer layer 410 may be made of $SiN_x$. In other embodiments, the sidewall spacer layer may be made of SiON or SiCN.

Moreover, along a direction parallel to the surface of the base substrate 100, the thickness of the first portion 401 of the sidewall spacer layer 410 may be determined by the dimensions of the subsequently-formed target pattern. In one embodiment, the thickness of the sidewall spacer layer 410 may be in a range of approximately 50 Å to 500 Å. That is, along the direction parallel to the surface of the base substrate 100, the thickness of the first portion 401 of the sidewall spacer layer 410 may be in a range of approximately 50 Å to 500 Å; and along the normal direction of the base substrate, the thickness of the second portion 402 of the sidewall spacer layer 410 may also be in a range of approximately 50 Å to 500 Å.

In one embodiment, the second portion 402 of the sidewall spacer layer 410 may be removed and the remaining first portion 401 of the sidewall spacer layer 410 may become a hard mask layer. Therefore, in order to improve the effect of removing the second portion 402 of the sidewall spacer layer 410 and improve the topography quality of the hard mask layer, prior to the removal of the second portion 402 of the sidewall spacer layer 410, the second portion 402 of the sidewall spacer layer 410 may be treated with plasma in a plasma treatment process 600 performed under a $H_2$ or He environment.

By performing the plasma treatment process 600 under the $H_2$ or He environment, the bonding energy of the material of the second portion 402 of the sidewall spacer layer 410 may be reduced. In addition, only a top region of the first portion 401 of the sidewall spacer layer 410 may be affected by the plasma treatment process 600. Accordingly, after the plasma treatment process 600, the material structure of the second portion 402 of the sidewall spacer layer 410 may not be completely the same as the material structure of the first portion 401 of the sidewall spacer layer 410 that is not affected by the plasma treatment process 600.

Further, by removing the second portion 402 of the sidewall spacer layer 410 through a wet etching process, the remaining first portion 401 of the sidewall spacer layer 410 may become the hard mask layer. During the wet etching process, the etch rate of the second portion 402 of the sidewall spacer layer 410 may be larger than the etch rate of the first portion 401 of the sidewall spacer layer 410 that is not affected by the plasma treatment process 600, and the etch rate of the second portion 402 of the sidewall spacer layer 410 may also be larger than the etch rate of the base substrate 100. Therefore, besides effectively removing the second portion 402 of the sidewall spacer layer 410 and ensuring desired topography for the formed hard mask layer 420, performing the plasma treatment process 600 under the $H_2$ or He environment may also reduce the consumption of the first portion 401 of the sidewall spacer layer 410 as well as the consumption of the base substrate 100 during the removal of the second portion 402 of the sidewall spacer layer 410. As such, the plasma treatment process 600 may help improve the performance and the yield of the formed semiconductor structure.

According to the disclosed semiconductor structure, during the formation of the hard mask layer, the top surface of the hard mask layer may be a planar surface. That is, an inclined top surface of the formed hard mask layer may be prevented. Therefore, the formed hard mask layer may have desired topography. Further, because the hard mask layer is used as the etch mask for etching the base substrate during the semiconductor fabrication process, variation in the etch species collection angle may be avoided, and thus the quality of the formed target pattern may be improved.

Compared to existing fabrication methods and semiconductor structures, the disclosed fabrication methods and semiconductor structures may demonstrate several advantages.

According to the disclosed fabrication methods for semiconductor structures, after forming the sidewall spacer film, the portion of the sidewall spacer film formed above the top surface of the core layers may be removed and only the portion of the sidewall spacer film formed on the base substrate and the sidewall surfaces of the core layers may be retained to serve as a sidewall spacer layer. Moreover, the sidewall spacer layer may further include a first portion formed on the sidewall surfaces of the core layers and a second portion formed on the base substrate. Therefore, the top surface of the first portion of the sidewall spacer layer may become a planer surface. Accordingly, after the second portion of the sidewall spacer layer is removed and the remaining first portion of the sidewall spacer layer becomes a hard mask layer, the top surface of the hard mask layer may be a planar surface. Compared to the method of forming a hard mask layer by etching etch the sidewall spacer film through a maskless etching process, the disclosed method may prevent forming an inclined top surface for the hard mask layer. Therefore, the formed hard mask layer may have desired topography. The formed hard mask layer may further used as an etch mask to subsequently etch the base substrate, and thus may avoid the variation of the etch species collection angle. Therefore, the quality of the formed target pattern may be improved, which may further improve the performance and the product yield of the formed semiconductor structure.

Further, the process to remove the second portion of the sidewall spacer layer may include performing a plasma treatment process on the second portion of the sidewall spacer layer under a $H_2$ or He environment, and then performing a wet etching process to remove the second portion of the sidewall spacer layer. During the plasma treatment process, H atoms or He atoms may be implanted into the second portion of the sidewall spacer layer, and thus reduce the bonding energy of the material of the second portion of the sidewall spacer layer.

Further, the second portion of the sidewall spacer layer may be removed by a wet etching process. During the wet etching process, the etch rate of the second portion of the sidewall spacer layer may be larger than the etch rate of the first portion of the sidewall spacer layer that is not affected by the plasma treatment process, and the etch rate of the second portion of the sidewall spacer layer may also be larger than the etch rate of the base substrate. Therefore, besides effectively removing the second portion of the sidewall spacer layer and ensuring desired topography for the formed hard mask layer, performing the plasma treatment process under the $H_2$ or He environment may also reduce the consumption of the first portion of the sidewall spacer layer and the consumption of the base substrate during the removal of the second portion of the sidewall spacer layer. As such, the plasma treatment process may help improve the performance and the yield of the formed semiconductor structure.

Moreover, the process to form the core layers may easily cause over etching of the base substrate so that the top surface of the portion of the base substrate under the core layers may be higher than the top surface of the portion of the base substrate exposed by the core layers. That is, the top surface of the portion of the base substrate under the core layers and the top surface of the portion of the base substrate exposed by the core layers may have a height difference. According to the disclosed methods, the second portion of the sidewall spacer layer is removed after removing the core layers. That is, the portion of the base substrate used to be under the core layers may be exposed in the process environment during the removal of the second portion of the sidewall spacer layer. Moreover, the process to remove the second portion of the sidewall spacer layer may easily cause certain consumption of the exposed portion of the base substrate so that the height difference may be reduced or even eliminated. After etching the base substrate in a subsequent process, the height difference between the top surfaces of the base substrate on the two sides of the target pattern may be reduced or eliminated. That is, the disclosed fabrication methods may solve the pitch walking problem for the formed target pattern.

According to the disclosed semiconductor structure, the semiconductor structure includes a sidewall spacer layer formed on a portion of the base substrate. The sidewall spacer layer further includes a first portion and a second portion. The second portion of the sidewall spacer layer includes a plurality of discrete regions formed on the base substrate and the first portion of the sidewall spacer layer is formed at one or both ends of each region of the second portion of the sidewall spacer layer. The first portion of the sidewall spacer layer and the second portion of the sidewall spacer layer are perpendicular to each other. That is, the thickness direction of the first portion of the sidewall spacer layer is parallel to the surface of the base substrate, and the thickness direction of the second portion of the sidewall spacer layer is perpendicular to the surface of the base substrate. Further, during the semiconductor fabrication process, the second portion of the sidewall spacer layer is removed, and the remaining first portion of the sidewall spacer layer becomes a hard mask layer. As such, the top surface of the hard mask layer is a planar surface. That is, an inclined top surface of the formed hard mask layer may be prevented. Therefore, the formed hard mask layer may have desired topography. Further, because the hard mask layer is used as the etch mask for etching the base substrate during the semiconductor fabrication process, variation in the etch species collection angle may be avoided, and thus the quality of the formed target pattern may be improved.

Moreover, the second portion of the sidewall spacer layer is a film layer experienced a plasma treatment process performed under a $H_2$ or He environment. Therefore, the bonding energy of the material of the second portion of the sidewall spacer layer may become relatively small, and accordingly, the material structure of the second portion of the sidewall spacer layer may not be completely the same as the material structure of the first portion of the sidewall spacer layer that is not affected by the plasma treatment process. During the subsequent etching process to remove the second portion of the sidewall spacer layer, the removal rate of the second portion of the sidewall spacer layer may be larger than the removal rate of the first portion of the sidewall spacer layer that is not affected by the plasma treatment process. Moreover, the removal rate of the second portion of the sidewall spacer layer may also be larger than the removal rate of the base substrate. Therefore, besides effectively removing the second portion of the sidewall spacer layer and ensuring desired topography for the formed hard mask layer, forming a hard mask layer according to the disclosed fabrication methods and semiconductor structures may also reduce the consumption of the first portion of the sidewall spacer layer as well as the consumption of the base substrate during the removal of the second portion of the sidewall spacer layer. As such, the disclosed fabrication methods and semiconductor structures may help improve the performance and the yield of the formed semiconductor structure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
a base substrate; and a sidewall spacer layer formed on the base substrate,
the sidewall spacer layer including:
a plurality of first sidewall spacer layers and a plurality of second sidewall spacer layers spaced apart from each other, wherein:
the plurality of first sidewall spacer layers have a planar top surface higher than a planar top surface of the plurality of second sidewall spacer layers,
at least one sidewall of a second sidewall spacer layer of the plurality of second sidewall spacer layers is formed on a first sidewall spacer layer of the plurality of first sidewall spacer layers,
the plurality of first sidewall spacer layers has a thickness greater than the plurality of second sidewall spacer layers, based on a surface of the base substrate, and
the plurality of first sidewall spacer layers has a material structure different than the plurality of second sidewall spacer layers.

2. The structure according to claim 1, wherein:
the plurality of first sidewall spacer layers has the material structure different than the plurality of second sidewall spacer layers by a plasma treatment for implanting one or more of hydrogen (H) atoms and helium (He) atoms into the plurality of second sidewall spacer layers.

3. The structure according to claim 1, wherein:
the sidewall spacer layer is made of a material including $SiN_x$, SiON, and SiCN.

4. The structure according to claim 1, wherein:
a thickness of the plurality of first sidewall spacer layers is in a range of approximately 50 Å to 500 Å.

5. The structure according to claim 1, wherein:
a thickness of the plurality of second sidewall spacer layers is in a range of approximately 50 Å to 500 Å.

6. The structure according to claim 2, wherein the plurality of second sidewall spacer layers is implanted with the one or more of hydrogen (H) atoms and helium (He) atoms using:
a gas flow rate of $H_2$ or He in a range of approximately 50 sccm to 500 sccm;
a pressure in a range of approximately 2 mTorr to 100 mTorr;
an offset power in a range of 0 W to approximately 500 W; and
a process time in a range of approximately 50 seconds to 700 seconds.

7. The structure according to claim 1, wherein:
the sidewall spacer layer on the base substrate includes one or more of an L-shaped structure and a U-shaped structure, each formed by the plurality of first and second sidewall spacer layers.

8. The structure according to claim 1, wherein:
one first sidewall spacer layer is formed on a sidewall of one second sidewall spacer layer, providing an L-shaped structure.

9. The structure according to claim 1, wherein:
one first sidewall spacer layer is formed on each sidewall of one second sidewall spacer layer, providing a U-shaped structure.

10. The structure according to claim 1, wherein:
the plurality of first sidewall spacer layers are used as a mask layer to etch the plurality of second sidewall spacer layers and the base substrate.

11. The structure according to claim 1, wherein:
each of the plurality of second sidewall spacer layers is connected with two adjacent first sidewall spacer layers.

\* \* \* \* \*